United States Patent
Tsukagoshi et al.

(10) Patent No.: US 6,731,169 B2
(45) Date of Patent: May 4, 2004

(54) DIFFERENTIAL AMPLIFIER CIRCUIT

(75) Inventors: Kunihiko Tsukagoshi, Tokyo (JP); Satoru Miyabe, Tokyo (JP); Kazuhisa Oyama, Tokyo (JP)

(73) Assignee: Nippon Precision Circuits, Tokyo (JP)

( * ) Notice: Subject to any disclaimer, the term of this patent is extended or adjusted under 35 U.S.C. 154(b) by 0 days.

(21) Appl. No.: 10/326,369

(22) Filed: Dec. 20, 2002

(65) Prior Publication Data

US 2003/0095004 A1 May 22, 2003

Related U.S. Application Data

(63) Continuation of application No. 09/838,864, filed on Apr. 20, 2001, now abandoned, and a continuation of application No. 09/195,473, filed on Nov. 18, 1998, now Pat. No. 6,242,980.

(30) Foreign Application Priority Data

Nov. 19, 1997 (JP) .......................................... 09-317862

(51) Int. Cl.$^7$ ............................................... H03F 3/45
(52) U.S. Cl. ...................... 330/253; 330/257; 330/261; 331/107 R; 331/117 R; 331/117 FE
(58) Field of Search ................................ 330/253, 257, 330/261; 331/107 R, 117 R, 117 FE

(56) References Cited

U.S. PATENT DOCUMENTS 6,242,980 B1 * 6/2001 Tsukagoshi et al. ........ 330/253

FOREIGN PATENT DOCUMENTS

JP 6268456 * 9/1984

OTHER PUBLICATIONS

Kovita et al. "High–precision IC quartz oscillator" IEEE European Frequency & Time Forum Mar. 5–7, 1996 pp 176–179.*

* cited by examiner

*Primary Examiner*—Michael B. Shingleton
(74) *Attorney, Agent, or Firm*—Schultz Roth & Zabel LLP; Joel E. Lutzker; John C. Garces

(57) ABSTRACT

The first amplifier circuit D1 is formed by connecting drains of a pair of N-channel MOS transistors forming the first current mirror circuit CM1 respectively to the drains of P-channel MOS transistors 1 and 2 as a differential input portion, and the second amplifier circuit D2 is formed by connecting drains of a pair of P-channel MOS transistors forming the second current mirror circuit CM2 respectively to the drains of N-channel MOS transistors 5 and 6 as a differential amplifier circuit. The first and second differential amplifier circuits D1 and D2 can amplify the first and second signals having cycles corresponding with each other with their duty ratios kept unchanged regardless of their operating point potentials. Further, the two outputs are combined into one output to suppress variation of the operating point potential of the output attributable to process-related factors, fluctuation of the power supply potential due to the oscillating operation and the like.

4 Claims, 9 Drawing Sheets

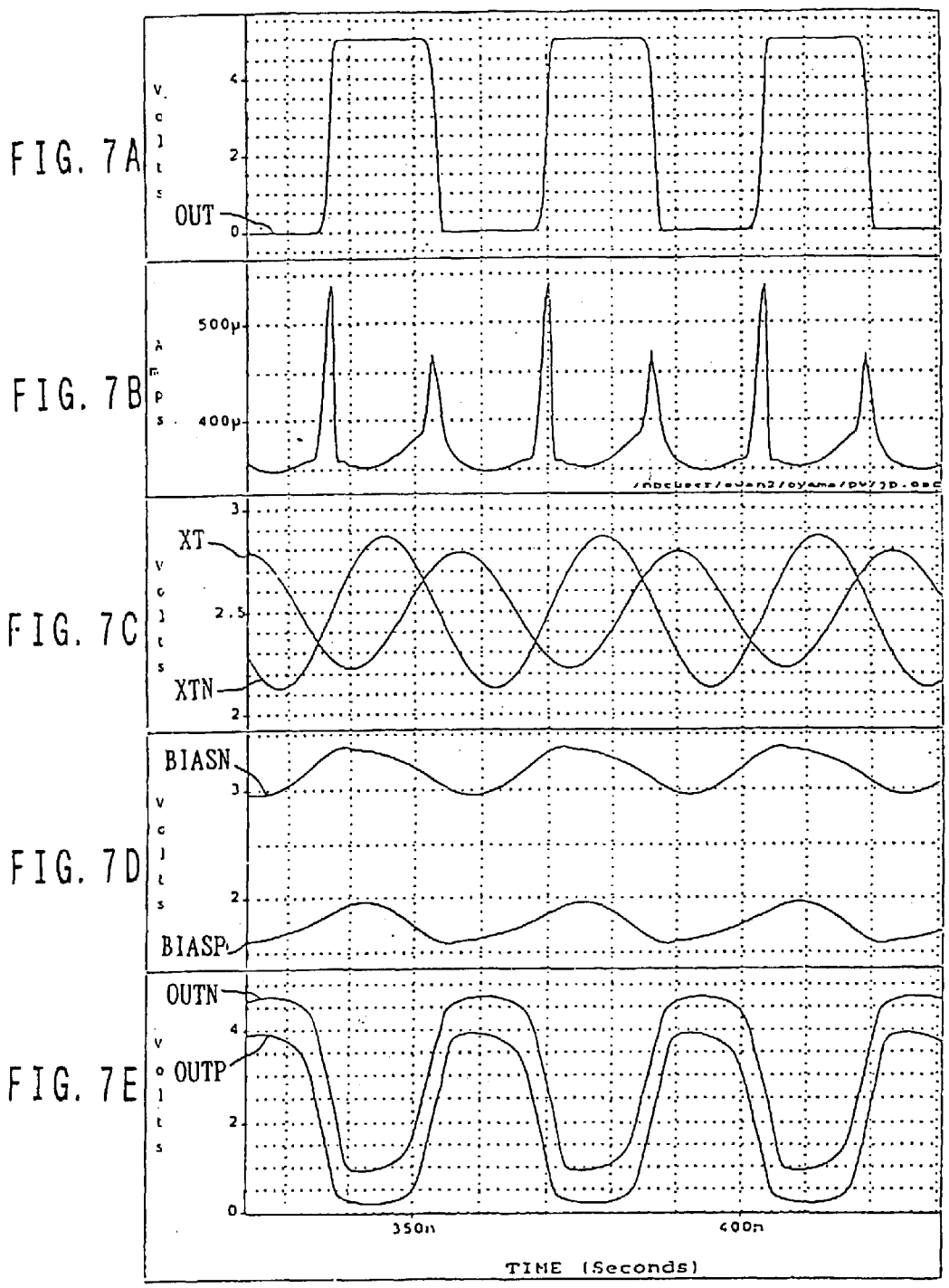

DIFFERENTIAL AMPLIFIER CIRCUIT

This Application is a Continuation Application of Ser. No. 09/838,864 filed Apr. 20, 2001, now abandoned, which is a Continuation Application of Ser. No. 09/195,473 filed Nov. 18, 1998, now U.S. Pat. No. 6,742,980.

BACKGROUND OF THE INVENTION

1. Field of the Invention

The present invention relates to an amplifier circuit in a CMOS integrated circuit and, more particularly, to a differential amplifier circuit.

2. Description of the Related Art

Presently, in a CMOS integrated circuit, alternating signals are normally amplified using a CMOS inverter. For example, in a quartz oscillation circuit as shown in FIG. 1, an oscillation output of a CMOS inverter X1 at a first stage accompanied by a quartz oscillator X't connected across input and output terminals thereof is sent to subsequent stages after being amplified further by a CMOS inverter X2 as a buffer circuit.

The potential of an operating point of the oscillation output of such a CMOS inverter fluctuates owing to process-related factors, fluctuation of power supply potential caused by the oscillation operation and the like to be out of a predetermined threshold of the CMOS inverter X2. It has been therefore difficult to set the duty ratio of the oscillation output at 1/2, and the duty ratio has been set in a certain allowable range.

A limitation is sometimes placed on the value of a current supplied to the CMOS inverter X1 in order to reduce power consumption. In such a case wherein the voltage amplitude of the oscillation output is reduced, the influence of the fluctuation of the operating point potential on the duty ratio becomes too significant to ignore.

SUMMARY OF THE INVENTION

Under such circumstances, according to the present invention, the first and second differential amplifier circuits amplify the first and second signals regardless of their operating point potentials with their duty ratios kept unchanged, and two outputs therefrom are combined into one output. This makes it possible to prevent the operating point potential of the output from varying due to process-related factors, fluctuation of the power supply potential caused by the oscillation operation and the like.

The first differential amplifier circuit used here comprises a differential input portion comprising the first and second MOS transistors and the first current mirror circuit comprising the third and fourth MOS transistors whose drains are connected to the drains of the first and second MOS transistors, respectively. The second differential amplifier circuit used here comprises a differential input portion comprising the fifth and sixth MOS transistors and second current mirror circuit comprising the seventh and eighth MOS transistors whose drains are connected to the drains of the fifth and sixth MOS transistors, respectively. There is provided an output buffer circuit for generating an output signal based on a signal generated at the drain of the fourth MOS transistor and a signal generated at the drain of the eighth MOS transistor.

Here, response of the differential amplifier circuit can be improved by especially connecting all of the gates of the MOS transistors forming the first and second current mirror circuits and connecting the drain of the fourth MOS transistor and the drain of the eighth MOS transistor to provide an input to a CMOS inverter as the output buffer described above. In addition, the reduction of power consumption can be further promoted by providing either or both of the first current control circuit for commonly connecting the sources of the first, second, seventh and eighth MOS transistors to the first potential source and controlling a current flowing therein and the second current control circuit for commonly connecting the sources of the third, fourth, fifth and sixth MOS transistors to the second potential source and controlling a current flowing therein.

Further, it is possible to suppress a current flowing through the output buffer and to promote the reduction of power consumption by providing the first current control circuit for commonly connecting the sources of the first and second MOS transistors to the first potential source and controlling a current flowing therein and the second current control circuit for commonly connecting the sources of the fifth and sixth MOS transistors to the second potential source and controlling a current flowing therein, and by using a circuit as the output buffer which comprises the ninth MOS transistor of the first conductivity type whose gate is connected to the gate of the fourth MOS transistor and a tenth MOS transistor of the second conductivity type whose gate is connected to the drain of the eighth MOS transistor with the drains of the ninth and tenth MOS transistors being connected to each other to generate an output signal at the connection point.

There is provided a differential amplifier circuit which includes the first differential amplifier circuit including a differential input portion comprising a pair of MOS transistors of the first conductivity type and the second differential amplifier circuit including a differential input portion comprising a pair of MOS transistors of the second conductivity type, in which the first signal and the second signal having a cycle corresponding with that of the first signal are input to both of the first and second differential amplifier circuits differential amplification output based on the first and second signals and in which the differential amplification outputs of the first and second amplifier circuits are combined to provide an output.

The differential amplifier circuit may comprise:

the first MOS transistor of the first conductivity type which receives the first signal at its gate;

the second MOS transistor of the second conductivity type which receives the second signal having a cycle corresponding with that of the first signal at its gate;

the first current mirror circuit comprising the third and fourth of MOS transistors of the second conductivity type, the drains of the third and fourth MOS transistor being connected to the drains of the first and second MOS transistors, respectively, the gates of the third and fourth MOS transistors being connected to each other and the gate and drain of the third MOS transistor being connected;

the fifth MOS transistor of the second conductivity type which receives the first signal at its gate:

the sixth MOS transistor of the second conductivity type which receives the second signal at its gate;

the second current mirror circuit comprising the seventh and eighth MOS transistors of the first conductivity type, the drains of the seventh and eight MOS transistors being connected to the drains of the fifth and sixth MOS transistors, respectively, the gates of the seventh and eighth MOS transistors being connected to each other and the gate and drain of the seventh MOS transistor being connected; and an output buffer circuit for generating an output signal based on a signal generated at the drain of the fourth MOS transistor and a signal generated at the drain of the eighth MOS transistor.

Preferably, the gates of the third and fourth MOS transistors and the gates of the seventh and eighth MOS transistors are connected, and the output buffer circuit is a CMOS inverter whose input terminal is connected to the connection point between the drain of the fourth MOS transistor and the drain of the eighth MOS transistor.

Also preferably, the output buffer circuit includes the ninth MOS transistor of the second conductivity type whose gate is connected to the drain of the fourth MOS transistor and the tenth MOS transistor of the first conductivity type whose gate is connected to the drain of the eighth MOS transistor, and the drains of the ninth and tenth MOS transistors are connected to each other to generate an output signal at the connection point.

It is also preferable to provide either or both of the first current control circuit for commonly connecting the sources of the first, second, seventh and eighth MOS transistors to the first potential source and controlling a current flowing therein and the second current control circuit for commonly connecting the sources of the third, fourth, fifth and sixth MOS transistors to the second potential source and controlling a current flowing therein.

BRIEF DESCRIPTION OF THE DRAWINGS

FIGS. 7A through 7E are waveform diagrams illustrating the operation of the circuit shown in FIG. 6;

DETAILED DESCRIPTION OF PREFERRED EMBODIMENTS

A description will now be made on a differential amplifier circuit according to the first embodiment of the present invention.

Figure 2:
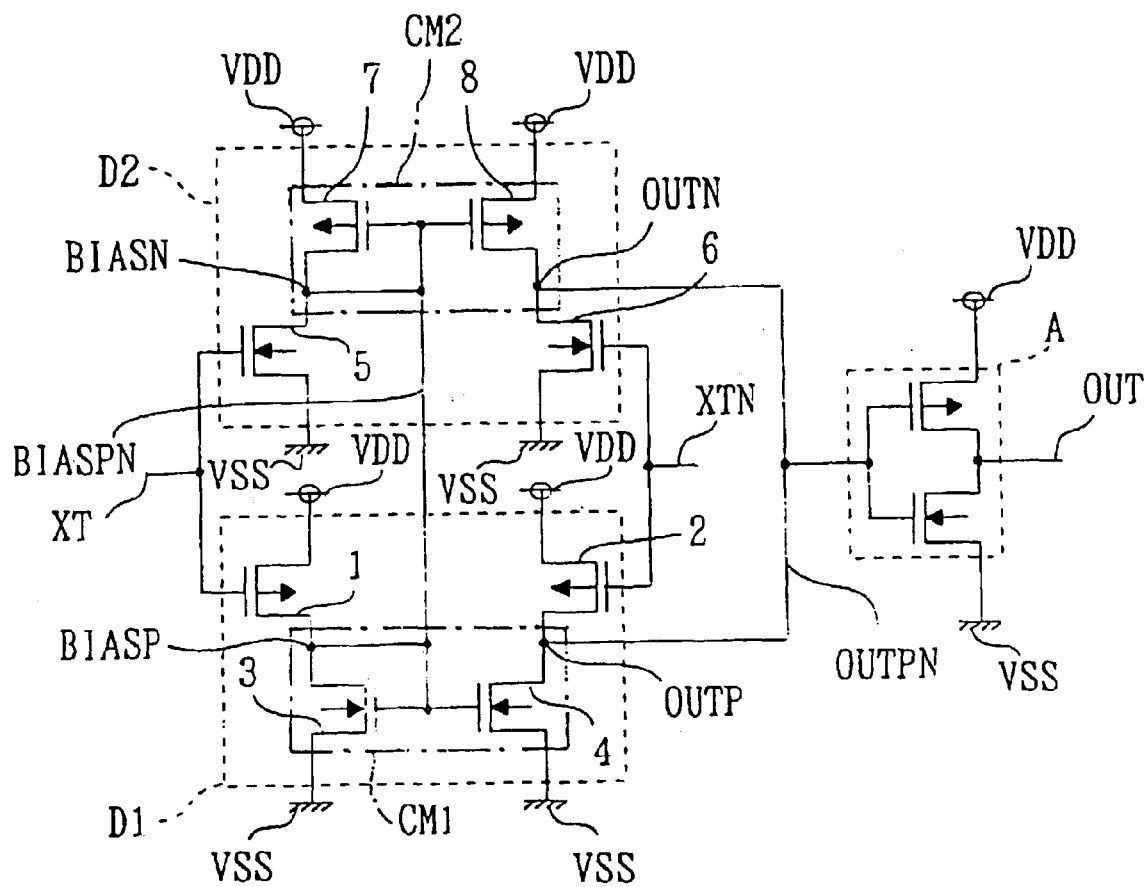
FIG. 2 is a circuit diagram illustrating a configuration of a differential amplifier circuit according to the first embodiment of the present invention.

A configuration of the present embodiment will be first described with reference to FIG. 2. In FIG. 2, reference numerals 1 and 2 designate P-channel MOS transistors as the first and second MOS transistors, respectively. Reference numerals 3 and 4 designate N-channel MOS transistors as the third and fourth MOS transistors, respectively. The drain and gate of the N-channel MOS transistor 3 are connected, and the gates of the N-channel MOS transistors 3 and 4 are connected to each other to form the first current mirror circuit CM1. The drains of the N-channel MOS transistors 3 and 4 are respectively connected to the drains of the P-channel MOS transistors 1 and 2 to use signals received at the gates of the P-channel MOS transistors 1 and 2 as differential inputs, thereby forming the first differential circuit D1 for generating a differential output at a terminal OUTP which is the connection point between the P-channel MOS transistor 2 and N-channel MOS transistor 4.

Reference numerals 5 and 6 designate N-channel MOS transistors as the fifth and sixth MOS transistors, respectively. Reference numerals 7 and 8 designate P-channel MOS transistors as the seventh and eighth MOS transistors, respectively. The drain and gate of the P-channel MOS transistor 7 are connected, and the gates of the P-channel MOS transistors 7 and 8 are connected to each other to form the second current mirror circuit CM2. The drains of the P-channel MOS transistors 7 and 8 are respectively connected to the drains of the N-channel MOS transistors 5 and 6 to use signals received at the gates of the N-channel MOS transistors 5 and 6 as differential inputs, thereby forming the second differential circuit D2 for generating a differential output at a terminal OUTN which is the connection point between the N-channel MOS transistor 6 and P-channel MOS transistor 8.

Figure 1:
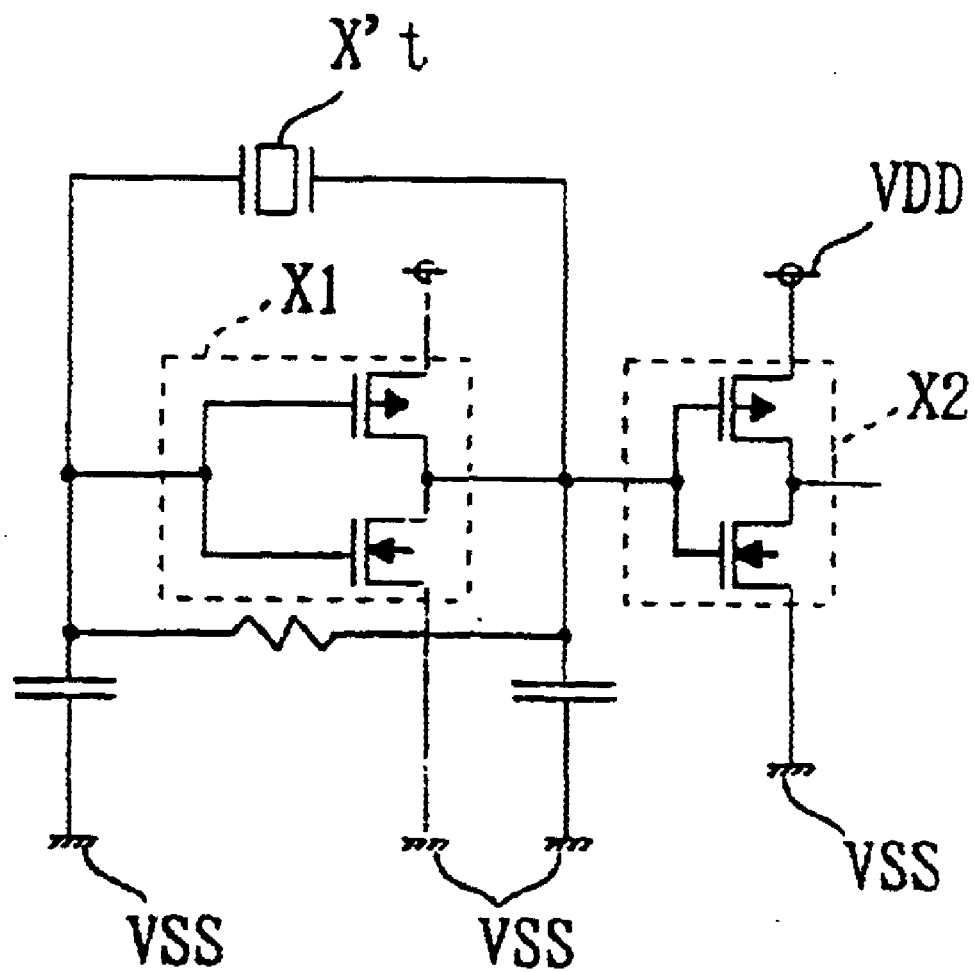
FIG. 1 is a circuit diagram illustrating a configuration of a conventional amplifier circuit.

The gates of the P-channel MOS transistor 1 and the N-channel MOS transistor 5 are connected to a common terminal XT to receive the first signal. The gates of the P-channel MOS transistor 2 and the N-channel MOS transistor 6 are connected to a common terminal XTN to receive the second signal. The present embodiment is directed to the amplification of an oscillation output of a quartz oscillation circuit wherein, for example, a signal at the input terminal of the CMOS inverter shown in FIG. 1 is used for the first signal and a signal at the output terminal thereof is used for the second signal. The terminals OUTP and OUTN each of which generates a differential output associated with the first and second signals are connected to a common terminal OUTPN. The gates of the N-channel MOS transistors 3 and 4 and the gates of the P-channel MOS transistors 7 and 8 are connected to a common terminal BIASPN.

Reference symbol A represents a CMOS inverter as the output buffer which is driven by the signal at the terminal OUTPN to generate the differential output associate with the first and second signals from an output terminal OUT.

The operation of the present embodiment will now be described with reference to the waveform diagrams in FIGS. 3A through 3D. FIGS. 3A through 3D show waveforms of the voltages at the respective terminals described above relative to a power supply terminal VSS as a reference where the power supply terminal VSS is at 0 V and another power supply terminal VDD at 5 V. Such conditions will remain unchanged for each of waveforms to be described later unless otherwise specified.

Figure 3:
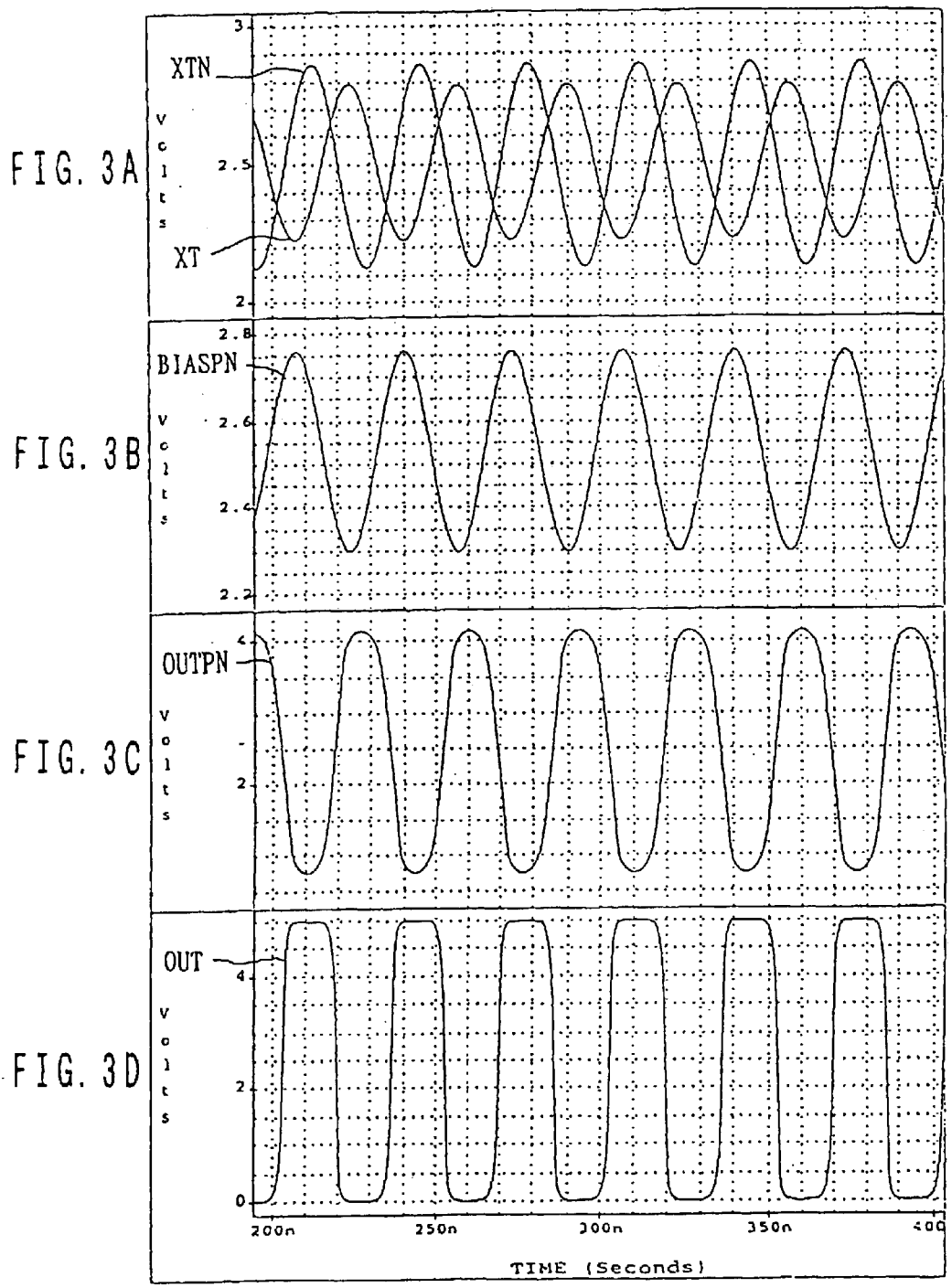
FIGS. 3A through 3D are waveform diagrams illustrating the operation of the circuit shown in FIG. 2.

First and second signals having voltage waveforms as indicated by XT and XTN in FIG. 3A are applied to the terminals XT and XTN, respectively. As a result, a voltage waveform as shown in FIG. 3B appears at the terminal BIASPN, and a waveform as shown in FIG. 3C appears at the terminal OUTPN. Such a signal at the terminal OUTPN is output as a signal having a voltage waveform as shown in FIG. 3D through the CMOS inverter A.

For the fluctuation of the power supply potentials at the power supply terminals VDD and VSS and the variation of the characteristics of elements caused by that of factors associated with manufacturing process, the first and second differential amplifier circuits D1 and D2 cancel the influences of the fluctuation and the variation thereon each other because the MOS transistors forming the differential amplifier circuits have opposite conductivity types to set the operating point potentials of the signals at the terminals BIASPN and OUTPN at an intermediate potential between the power supply terminals VDD and VSS. As a result, the terminal OUTPN provides an output for which the first and second signals are amplified with the duty ratio thereof unchanged and the operating point potential matches the above intermediate potential regardless of the operating point potentials of the first and second signals. Since the threshold potential of the CMOS inverter A is set equal to a predetermined intermediate potential, the duty ratio of the output of the CMOS inverter A is normally 1/2. The output at the terminal OUTPN is a signal which maintains a sufficiently large amplitude relative to the range of fluctuation of the operating point potential attributable to fluctuation of the power supply potential which may occur. It is therefore possible to suppress fluctuation of the duty ratio of the output of the CMOS inverter A which receives the output.

Since the gates of the MOS transistors forming the first and second current mirror circuits CM1 and CM2 are connected at the terminal BIASPN, those gates are biased at around the intermediate potential to achieve an improvement in the speed of response to an input signal over that achievable where there is no connection through the terminal BIASPN.

The second embodiment of the present invention will now be described with reference to FIG. 4.

Figure 4:
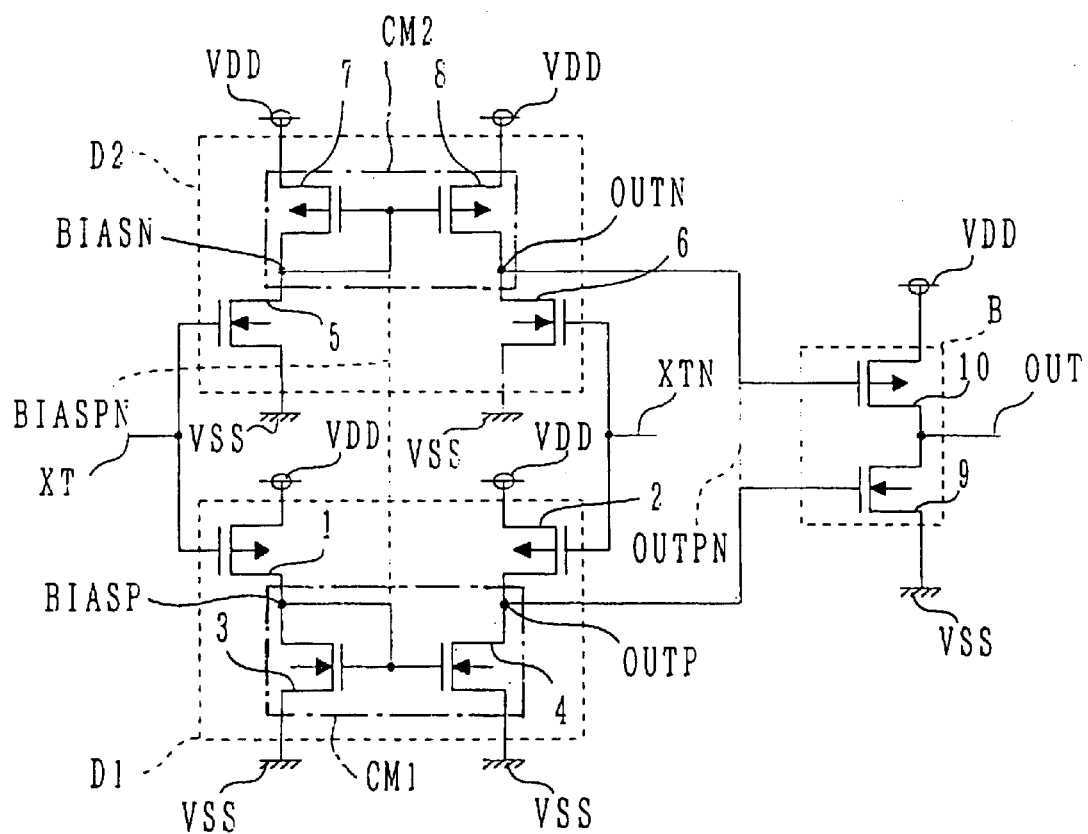
FIG. 4 is a circuit diagram illustrating a configuration of a differential amplifier circuit according to the second embodiment of the present invention.

The operation of each terminal of the differential amplifier circuit in FIG. 2 is substantially the same as that in the circuit shown in FIG. 4 when the first and second signals have small voltage amplitudes. Reference numerals in FIG. 4 that are the same as those in FIG. 2 designate like elements, and this equally applies to each of the figures to be described later. In the circuit shown in FIG. 4, the terminals BIASPN and OUTPN in the circuit of FIG. 2 have been deleted as indicated by the broken lines, and the terminals OUTP and OUTN are connected to the gate of an N-channel MOS transistor 9 and the gate of a P-channel MOS transistor 10, respectively. An output buffer B is formed by the N-channel MOS transistor 9 and P-channel MOS transistor 10.

Figure 5:
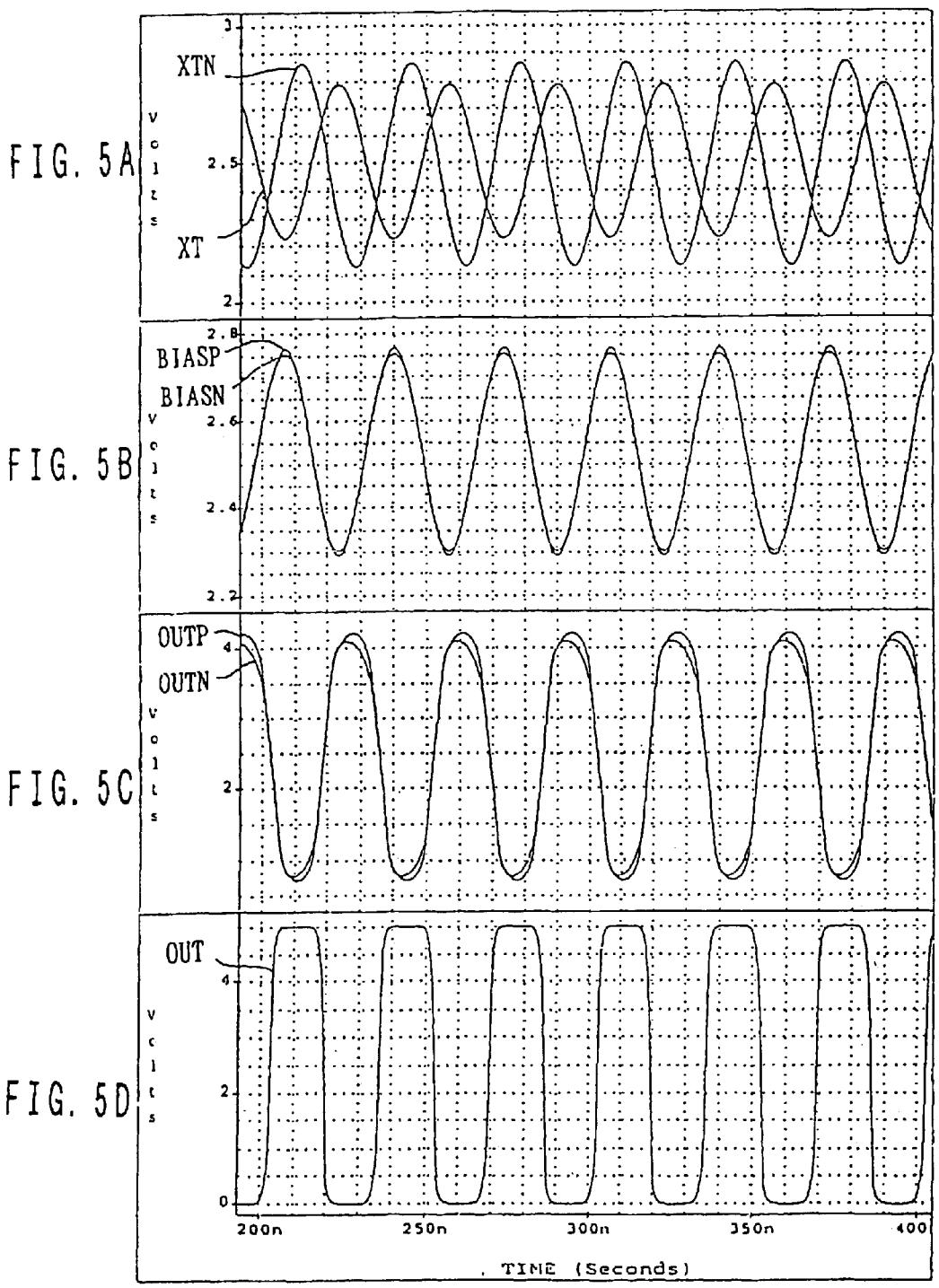
FIGS. 5A through 5D are waveform diagrams illustrating the operation of the circuit shown in FIG. 4.

FIGS. 5A through 5D show voltage waveforms at respective terminals of the differential amplifier circuit in FIG. 4. FIG. 5A shows voltage waveforms at the terminals XT and XTN. FIG. 5B shows voltage waveforms at the terminals BIASP and BIASN, and the waveform closer to the power supply terminal VSS is the voltage waveform at the terminal BIASP. FIG. 5C shows voltage waveforms at the terminals OUTP and OUTN, and the waveform closer to the power supply terminal VDD is the voltage waveform at the terminal OUTP. FIG. 5D shows waveforms at the terminal OUT. Referring to the characteristics of the outputs of the first and second differential amplifier circuits D1 and D2, i.e., the signals at the terminals OUTP and OUTN, as shown in FIGS. 5A through 5D, the former exhibits excellent response at rising and the latter exhibits excellent response at falling. Such effects of the first and second differential amplifier circuits are combined in the differential amplifier circuit in FIG. 2 by connecting the terminals BIASPN and OUTPN. In the differential amplifier circuit shown in FIG. 4, the advantages of the first and second differential amplifier circuits D1 and D2 are better combined by driving the N-channel MOS transistor 9 and P-channel MOS transistor 10 by the signals at the terminals OUTP and OUTN, respectively. Specifically, this configuration makes it possible to turn on and off the N-channel MOS transistor 9 and P-channel MOS transistor 10 simultaneously in a complementary manner to obtain an output having a duty ratio of 1/2 from the output buffer B. Such an output is also protected from the influences of process-related factors, fluctuation of the power supply potential attributable to the oscillation operation and the like similarly to the output of the circuit shown in FIG. 2. In addition, a through current as encountered in the CMOS inverter A shown in FIG. 2 can be significantly reduced at the output buffer B.

A third embodiment of the present invention will now be described.

According to the present embodiment, the reduction of power consumption is further pursued in the differential amplifier circuit shown in FIG. 4. In the differential amplifier circuit shown in FIG. 6, a P-channel MOS transistor 1 as the first current control circuit is provided between the source of P-channel MOS transistors 1 and 2 and a power supply terminal VDD, and an N-channel MOS transistor 12 as the second current control circuit is provided between the sources of N-channel MOS transistors 5 and 6 and a power supply terminal VSS. When the gates of the P-channel MOS transistor 11 and N-channel MOS transistor 12 are brought to be in "L" and "H", respectively, a current is supplied to enable the differential amplifier circuit to be operated. When the gates are in "H" and in "L", respectively, the current is stopped to put the differential amplifier circuit in a standby state. Alternatively, a content current circuit may be used.

Figure 6:
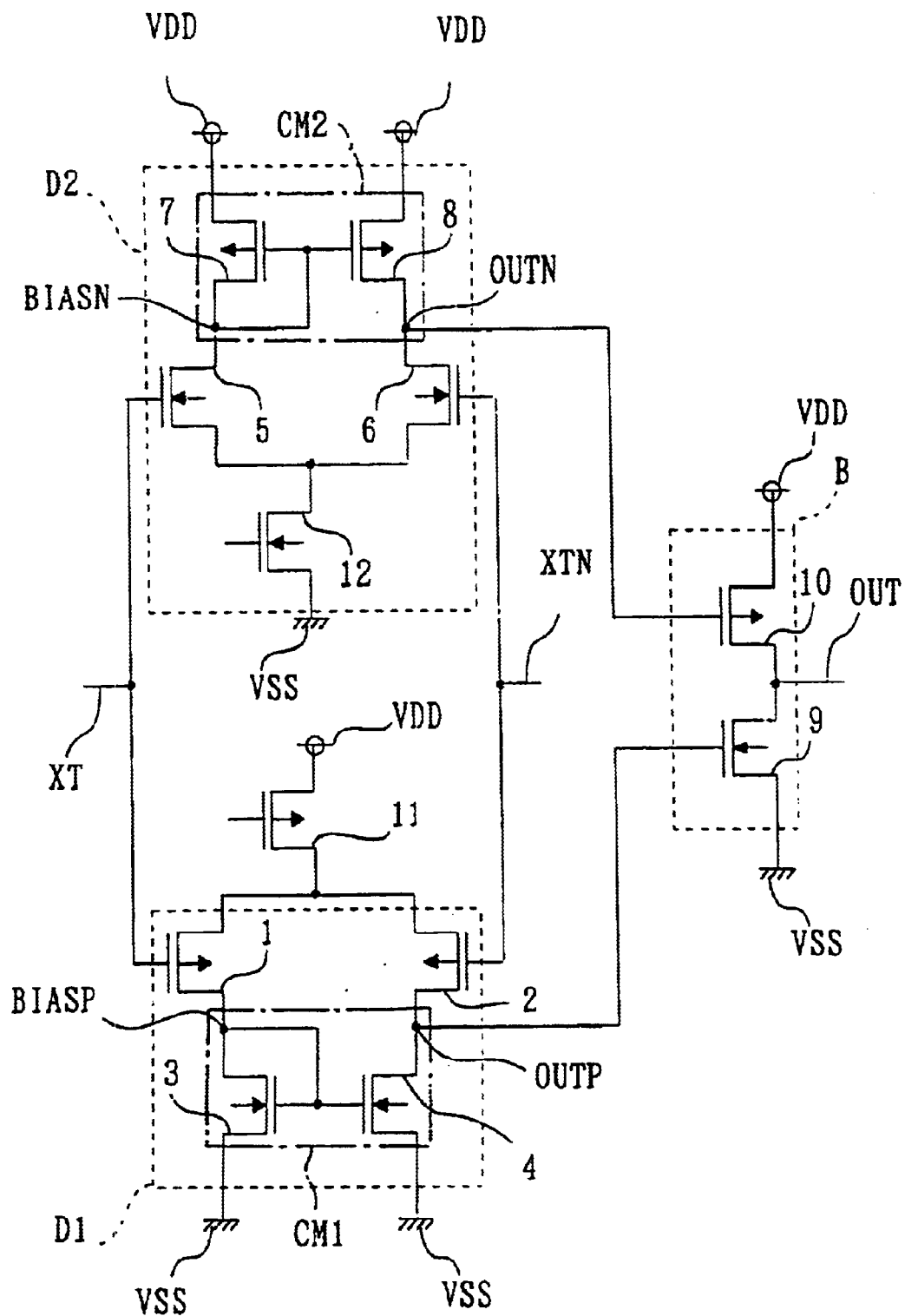
FIG. 6 is a circuit diagram illustrating a configuration of a differential amplifier circuit according to the third embodiment of the present invention.
Figures 8A, 8B, 8C, 8D, 8E:
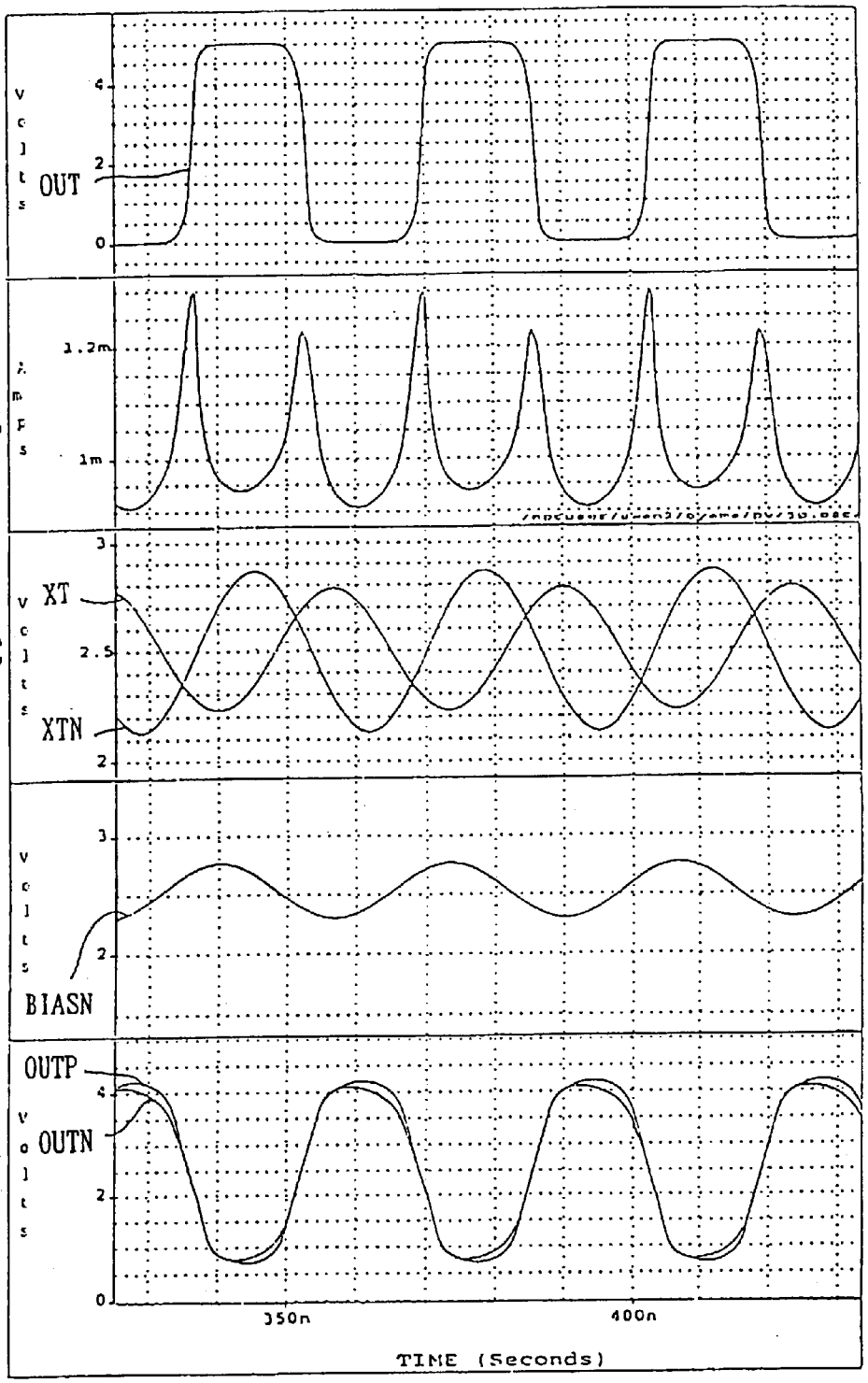
FIGS. 8A through 8E are waveform diagrams of the circuit of the second embodiment shown in FIG. 4 for the comparison with the waveform diagrams shown in FIG. 7A through FIG. 7E.

Voltage waveforms at respective terminals of the differential amplifier circuit of FIG. 6 are as shown in FIGS. 7A and 7C through 7E, and FIG. 7B shows a current waveform. FIG. 7A shows a voltage waveform at an output terminal OUT; FIG. 7C shows voltage waveforms at terminals XT and XTN; FIG. 7D shows voltage waveforms at terminals BIASP and BIASN; and FIG. 7E shows voltage waveforms at terminals OUTP and OUTN. FIG. 7B shows the total value of currents that flow in the differential amplifier circuit represented a current waveform obtained by adding all currents that flow through the power supply terminals VDDs here. For the purpose of comparison, FIGS. 8A through 8E show waveforms at respective terminals of the differential amplifier circuit of FIG. 4 which correspond to the waveforms shown in FIGS. 7A through 7E. As shown in FIGS. 7B and 8B, while the total value of currents flowing through the differential amplifier circuit in FIG. 6 is about 540 $\mu$A at the maximum, the maximum value is 1.3 mA for the current flowing through the differential amplifier circuit of FIG. 4. It is thus possible to decrease the total value of currents significantly by providing the P-channel MOS transistor 11 and N-channel MOS transistor 12 for further reduction of power consumption. Further, as apparent from the waveforms, the N-channel MOS transistor 9 and P-channel MOS transistor 10 can be simultaneously turned on and off in a complementary manner by the signals at the terminals OUTP and OUTN as in the differential amplifier circuit of FIG. 4 to provide the same effect and advantage.

Figure 9A:
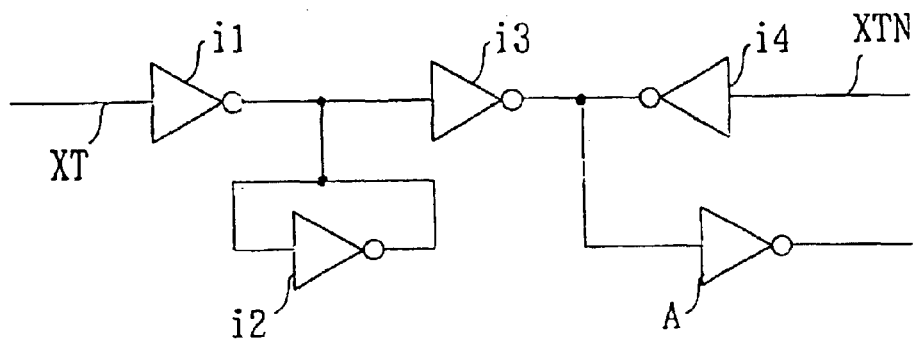
FIGS. 9A through 9C are schematic circuit diagrams illustrating modified configurations of the differential amplifier according to the first embodiment of the present invention.
Figure 9B:
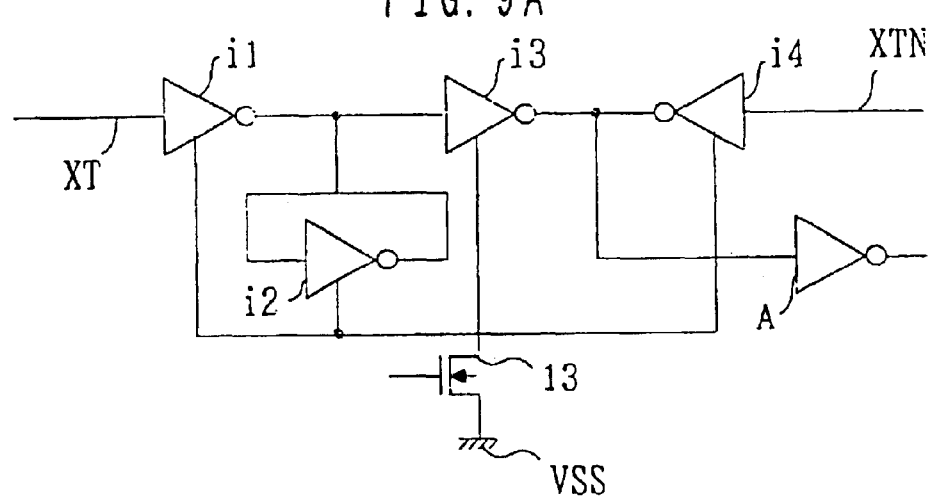
Figure 9C:
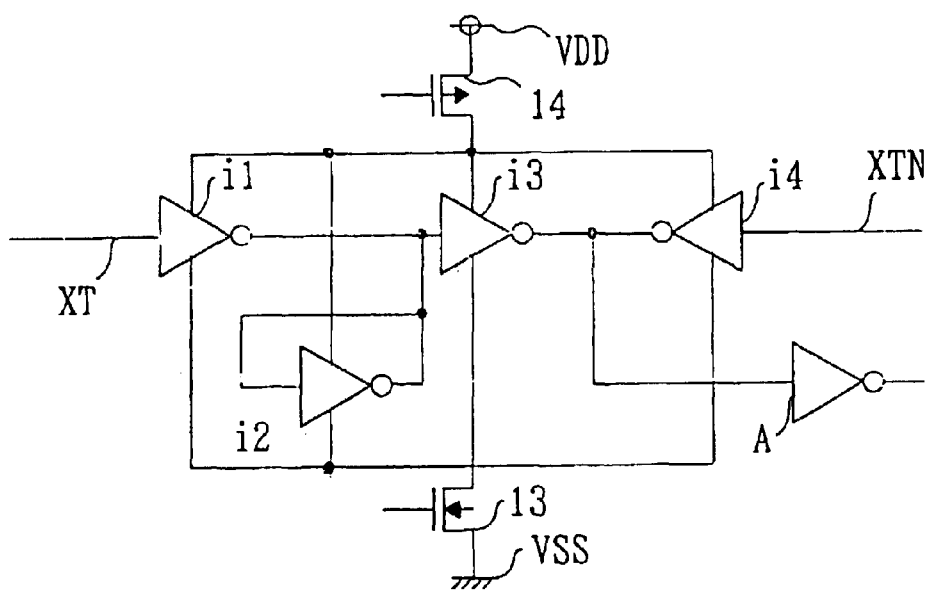

The third embodiment has been explained with respect to further reduction of power consumption from that of the differential amplifier circuit described in the second embodiment. The present invention, however, is not limited thereto, and further reduction of power consumption can be also achieved in the differential amplifier circuit described in the first embodiment, which will be illustrated in FIGS. 9A through 9C. As shown in FIG. 9A, the differential amplifier circuit in FIG. 2 can be represented by CMOS inverters i1 through i4. The correspondence between the CMOS inverters i1 through i4 with the transistors in the differential amplifier circuit of FIG. 2 will not be particularly described here because it will be understood by reviewing the connection between the terminals in FIG. 2. As shown in FIG. 9B, an N-channel MOS transistor 13 may be provided as a common current control circuit between the sources of all the N-channel MOS transistors forming the CMOS inverters i1 through i4 and the power supply terminal VSS. In addition, as shown in FIG. 9C, a P-channel MOS transistor 14 may be provided as a common current control circuit between the sources of all the P-channel MOS transistors forming the CMOS inverters i1 through i4 and the power supply terminal VDD. The N-channel MOS transistor 13 and P-channel MOS transistor 14 may be capable of controlling the differential amplifier circuit like the P-channel MOS transistor 11 and N-channel MOS transistor 12 such that the circuit enters an operating or standby state or, alternatively, a constant current circuit may be provided instead.

According to the present invention, the outputs of the first and second differential amplifier circuits having respective differential input portions comprising MOS transistors of the first and second conductivity types are combined into one differential amplifier circuit, and differential amplification is performed on the first signal and the second signal having a cycle corresponding with that of the first signal to amplify the first or second signal under no influence of process-related factors, fluctuation of the power supply potential due to the oscillation operation and the like to obtain an output of predetermined duty ratio. Specifically, differential amplification on the first and second signals allows the first and second signals to be amplified with their duty ratio kept unchanged regardless of their operating point potentials. By combining the outputs of those two differential amplifier circuits into one output, it becomes possible to suppress fluctuation of the operating point potential of the output attributable to process-related factors, fluctuation of the power supply potential due to the oscillating operation and the like.

The invention shown in FIG. 2 makes it especially possible to improve response in addition to the above-described effect. According to the invention shown in FIG. 6, it becomes possible to suppress a through current of an output buffer, thereby reducing power consumption further. According to the invention shown in FIG. 9C, the value of currents consumed in a differential amplifier circuit as a whole can be decreased to promote the reduction of power consumption further.

As many apparently widely different embodiments of the present invention may be made without departing from the spirit and scope thereof, it is to be understood that the invention is not limited to the specific embodiments thereof except as defined in the appended claims.

What is claimed is:

1. An oscillation circuit, comprising:
   an oscillator having a first signal and a second signal from first and second terminals, respectively, each of said first and second signals having an operating point potential that is different than the other and said first signal being input to both said first and second differential amplifier circuits and said second signal being input to both said first and second differential amplifier circuits to generate differential amplification outputs based on said first and second signals;
   a first MOS transistor of a first conductivity type having a source, a drain and a gate, and receiving said first signal at the gate thereof;
   a second MOS transistor of the first conductivity type having a source, a drain and a gate, and receiving said second signal at the gate thereof;
   a first current mirror circuit comprising a third and a fourth MOS transistors of a second conductivity type each having a source, a drain and a gate, the drains of said third and fourth MOS transistor being connected to the drains of said first and second MOS transistors, respectively, the gates of the third and fourth MOS transistors connected to each other and the gate and drain of said third MOS transistor;
   a fifth MOS transistor of the second conductivity type having a source, a drain and a gate, and receiving the first signal at the gate thereof;
   a sixth MOS transistor of the second conductivity type having a source, a drain and a gate, and receiving the second signal at the gate thereof;
   a second current mirror circuit comprising a seventh and an eighth MOS transistors of the first conductivity type each having a source, a drain and a gate, the drains of said seventh and eighth MOS transistors being connected to the drains of said fifth and sixth MOS transistors, respectively, the gates of the seventh and eighth MOS transistors being connected to each other and the gate and drain of said seventh MOS transistor being connected; and
   an output buffer circuit for generating an output signal based on a signal generated at the drain of said fourth MOS transistor and a signal generated at the drain of said eighth MOS transistor.

2. The differential amplifier circuit according to claim 1, wherein said output buffer circuit comprises a ninth MOS transistor of the second conductivity type having a source, a drain and a gate which is connected to the drain of said fourth MOS transistor and a tenth MOS transistor of the first conductivity type having a source, a drain and a gate which is connected to the drain of said eighth MOS transistor, and the drains of said ninth and tenth MOS transistors are connected to each other to generate an output signal at the connection point.

3. The differential amplifier circuit according to claim 2, wherein the sources of said first and second MOS transistors are connected to a first potential source through a first current control circuit common to both of them, the sources of said third and fourth MOS transistors are connected to a second potential source, the sources of said fifth and sixth MOS transistors are connected to said second potential source through a second current control circuit common to both of them, the sources of said seventh and eighth MOS transistors are connected to said first potential source, and the sources of said ninth and tenth MOS transistors are connected to said second and first potential sources, respectively.

4. An oscillation circuit, comprising:
   a first differential amplifier circuit including a differential input portion comprising a pair of MOS transistors of a first conductivity type;
   a second differential amplifier circuit including a differential input portion comprising a pair of MOS transistors of a second conductivity type; and
   an oscillator having a first signal and a second signal from first and second terminals, respectively, each of said first and second signals having an operating point potential that is different than the other and said first signal being input to both said first and second differential amplifier circuits and said second signal being input to both said first and second differential amplifier circuits to generate differential amplification outputs based on said first and second signals;
   wherein the differential amplification outputs of said first and second differential amplification circuits are combined to provide an output.

* * * * *